United States Patent
Lin (10) Patent No.: US 12,327,610 B2
(45) Date of Patent: *Jun. 10, 2025

(54) DATA RECEIVING CIRCUIT, DATA RECEIVING SYSTEM AND MEMORY DEVICE

(71) Applicant: CHANGXIN MEMORY TECHNOLOGIES, INC., Hefei (CN)

(72) Inventor: Feng Lin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 190 days.

This patent is subject to a terminal disclaimer.

(21) Appl. No.: 18/154,794

(22) Filed: Jan. 14, 2023

(65) Prior Publication Data

US 2023/0420015 A1 Dec. 28, 2023

Related U.S. Application Data

(63) Continuation of application No. PCT/CN2022/104759, filed on Jul. 8, 2022.

(30) Foreign Application Priority Data

Jun. 23, 2022 (CN) .......................... 202210726620.8

(51) Int. Cl.
*G11C 7/00* (2006.01)
*G11C 7/06* (2006.01)
(Continued)

(52) U.S. Cl.
CPC .............. *G11C 7/20* (2013.01); *G11C 7/067* (2013.01); *G11C 7/222* (2013.01)

(58) Field of Classification Search
CPC .................................................. G11C 7/1051
(Continued)

(56) References Cited

U.S. PATENT DOCUMENTS 6,151,648 A 11/2000 Haq
6,504,778 B1 1/2003 Uekubo
(Continued)

FOREIGN PATENT DOCUMENTS

CN 104183258 A 12/2014
CN 108694962 A 10/2018
(Continued)

OTHER PUBLICATIONS

European Patent Office, the Extended European Search Report Issued in Application No. 22854456.5, Feb. 7, 2024, Germany, 10 pages.

(Continued)

*Primary Examiner* — Hoai V Ho
(74) *Attorney, Agent, or Firm* — Kilpatrick Townsend & Stockton LLP (57) ABSTRACT

Embodiments provide a data receiving circuit. The data receiving circuit includes a first amplifier circuit and a second amplifier circuit. The first amplifier circuit is configured to receive a data signal, a first reference signal and a second reference signal, perform a first comparison between the data signal and the first reference signal and output a first signal pair, and perform a second comparison between the data signal and the second reference signal and output a second signal pair. The second amplifier circuit is configured to select to receive the first signal pair or the second signal pair as input signal pairs based on a feedback signal, amplify a voltage difference between the input signal pairs, and output a first output signal and a second output signal, wherein the feedback signal is obtained based on previously received data.

18 Claims, 4 Drawing Sheets

(51) Int. Cl.
*G11C 7/20* (2006.01)
*G11C 7/22* (2006.01)

(58) Field of Classification Search
USPC .................................................. 365/189.17
See application file for complete search history.

(56) References Cited

U.S. PATENT DOCUMENTS

| | | | |
|---|---|---|---|
| 7,477,704 | B1 | 1/2009 | Cornelius |
| 9,542,991 | B1 | 1/2017 | Xie et al. |
| 9,806,918 | B1 | 10/2017 | Su et al. |
| 10,091,031 | B1 | 10/2018 | Dimitriu |
| 2007/0201291 | A1 | 8/2007 | Cho |
| 2008/0088365 | A1 | 4/2008 | Jang |
| 2008/0089155 | A1 | 4/2008 | Bae |
| 2010/0246693 | A1 | 9/2010 | Ushio et al. |
| 2012/0063242 | A1 | 3/2012 | Kim et al. |
| 2020/0194043 | A1 | 6/2020 | Karim |
| 2021/0174844 | A1 | 6/2021 | Choi et al. |
| 2021/0408970 | A1 | 12/2021 | Hong et al. |
| 2022/0173744 | A1 | 6/2022 | Lee et al. |
| 2023/0012066 | A1 | 1/2023 | Gu |
| 2023/0016678 | A1* | 1/2023 | Lin ........................ G11C 7/222 |
| 2023/0421103 | A1* | 12/2023 | Lin ........................ G11C 7/1087 |
| 2024/0005966 | A1* | 1/2024 | Lin ........................ G11C 7/222 |

FOREIGN PATENT DOCUMENTS

| | | |
|---|---|---|
| CN | 109328434 A | 2/2019 |
| CN | 111049540 A | 4/2020 |
| CN | 111052240 A | 4/2020 |
| CN | 111614332 A | 9/2020 |
| CN | 112204662 A | 1/2021 |
| CN | 113556104 A | 10/2021 |
| CN | 113852367 A | 12/2021 |
| KR | 20120027586 A | 3/2012 |
| KR | 20210073217 A | 6/2021 |

OTHER PUBLICATIONS

United States Patent and Trademark office, Non-Final office action issued in related U.S. Appl. No. 17/952,394 on Aug. 13, 2024.
Korean Intellectual Property Office, Office Action Issued in Application No. 10-2023-7003894, Sep. 27, 2024, 17 pages.

* cited by examiner

DATA RECEIVING CIRCUIT, DATA RECEIVING SYSTEM AND MEMORY DEVICE

CROSS-REFERENCE TO RELATED APPLICATION

This application is a continuation of PCT/CN2022/104759, filed on Jul. 8, 2022, which claims priority to Chinese Patent Application No. 202210726620.8 titled "DATA RECEIVING CIRCUIT, DATA RECEIVING SYSTEM AND MEMORY DEVICE" and filed on Jun. 23, 2022, the entire contents of which are incorporated herein by reference.

TECHNICAL FIELD

Embodiments of the present disclosure relate to the field of semiconductor technology, and more particularly, to a data receiving circuit, a data receiving system, and a memory device.

BACKGROUND

In memory applications, as signal transmission rate becomes faster and faster, channel loss has a greater and greater impact on signal quality, which easily leads to intersymbol interference. In addition, differences between level values of data signals received by data receiving circuits in the memory and level values of reference signals may have a negative effect on determination of the data receiving circuits on the data signals, thereby adversely affecting accuracy of signals outputted from the data receiving circuits. At present, typically an equalizer is utilized to compensate for a channel. A continuous time linear equalizer (CTLE) or a decision feedback equalizer (DFE) may be selected as the equalizer.

However, the currently employed equalizer has limited ability in adjusting the data signals, and the accuracy of the signals outputted from the data receiving circuits needs to be improved, and thus receiving performance of the data receiving circuits needs to be improved.

SUMMARY

Embodiments of the present disclosure provide a data receiving circuit, a data receiving system, and a memory device, which are at least beneficial to improving receiving performance of the data receiving circuit.

According to some embodiments of the present disclosure, one aspect of the embodiments of the present disclosure provides a data receiving circuit, which includes a first amplifier circuit and a second amplifier circuit. The first amplifier circuit is configured to receive a data signal, a first reference signal and a second reference signal, perform a first comparison between the data signal and the first reference signal and output a first signal pair as a result of the first comparison, perform a second comparison between the data signal and the second reference signal, and output a second signal pair as a result of the second comparison. A level value of the first reference signal is different from a level value of the second reference signal, the first signal pair includes a first signal and a second signal, and the second signal pair includes a third signal and a fourth signal. The second amplifier circuit is configured to select to receive the first signal pair or the second signal pair as input signal pairs based on a feedback signal, amplify a voltage difference between the input signal pairs, and output a first output signal and a second output signal as a result of the amplification, where the feedback signal is obtained based on previously received data.

In some embodiments, the first amplifier circuit includes: a first comparison circuit having a first node and a second node, and a second comparison circuit having a third node and a fourth node. The first comparison circuit is configured to receive the data signal and the first reference signal and perform the first comparison, and output the first signal and the second signal respectively through the first node and the second node. The second comparison circuit is configured to receive the data signal and the second reference signal and perform the second comparison, and output the third signal and the fourth signal respectively through the third node and the fourth node.

In some embodiments, the first comparison circuit includes a first current source and a first comparison subcircuit. The first current source is connected between a power supply node and a fifth node, and the first current source is configured to provide a current to the fifth node in response to a sampling clock signal. The first comparison subcircuit is connected to the first node, the second node, and the fifth node. The first comparison subcircuit is configured to receive the data signal and the first reference signal, perform the first comparison when the first current source provides the current to the fifth node, and output the first signal and the second signal. The second comparison circuit includes a second current source and a second comparison subcircuit. The second current source is connected between the power supply node and a sixth node, and the second current source is configured to provide a current to the sixth node in response to the sampling clock signal. The second comparison subcircuit is connected to the third node, the fourth node, and the sixth node. The second comparison subcircuit is configured to receive the data signal and the second reference signal, perform the second comparison when the second current source provides the current to the sixth node, and output the third signal and the fourth signal.

In some embodiments, a circuit structure of the first current source is the same as that of the second current source; and a circuit structure of the first comparison subcircuit is the same as that of the second comparison subcircuit.

In some embodiments, the first current source includes a first PMOS transistor connected between the power supply node and the fifth node, and a gate of the first PMOS transistor is configured to receive the sampling clock signal. The second current source includes a second PMOS transistor connected between the power supply node and the sixth node, and a gate of the second PMOS transistor is configured to receive the sampling clock signal.

In some embodiments, the first comparison subcircuit includes a third PMOS transistor and a fourth PMOS transistor. The third PMOS transistor is connected between the first node and the fifth node, and a gate of the third PMOS transistor is configured to receive the data signal. The fourth PMOS transistor is connected between the second node and the fifth node, and a gate of the fourth PMOS transistor is configured to receive the first reference signal. The second comparison subcircuit includes a fifth PMOS transistor and a sixth PMOS transistor. The fifth PMOS transistor is connected between the third node and the sixth node, and a gate of the fifth PMOS transistor is configured to receive the data signal. The sixth PMOS transistor is connected between the fourth node and the sixth node, and a gate of the sixth PMOS transistor is configured to receive the second reference signal.

In some embodiments, the first amplifier circuit further includes a first reset subcircuit and a second reset subcircuit. The first reset subcircuit is connected to the first node and the second node, and the first reset subcircuit is configured to reset the first node and the second node. The second reset subcircuit is connected to the third node and the fourth node, and the second reset subcircuit is configured to reset the third node and the fourth node.

In some embodiments, the first reset subcircuit includes a first NMOS transistor and a second NMOS transistor. The first NMOS transistor is connected between the first node and a ground terminal, and a gate of the first NMOS transistor is configured to receive a first reset signal. The second NMOS transistor is connected between the second node and the ground terminal, and a gate of the second NMOS transistor is configured to receive the first reset signal. The second reset subcircuit includes a third NMOS transistor and a fourth NMOS transistor. The third NMOS transistor is connected between the third node and the ground terminal, and a gate of the third NMOS transistor is configured to receive the first reset signal. The fourth NMOS transistor is connected between the fourth node and the ground terminal, and a gate of the fourth NMOS transistor is configured to receive the first reset signal.

In some embodiments, the second amplifier circuit includes a first input subcircuit, a second input subcircuit, and a latch subcircuit. The first input subcircuit is connected to a seventh node and an eighth node, and the first input subcircuit is configured to be turned on in response to the feedback signal to receive the first signal pair and compare the first signal pair, and respectively provide a signal to the seventh node and the eighth node. The second input subcircuit is connected to the seventh node and the eighth node, and the second input subcircuit is configured to be turned on in response to the feedback signal to receive the second signal pair and compare the second signal pair, and provide a signal to the seventh node and the eighth node, respectively. Either of the first input subcircuit and the second input subcircuit is selectively turned on based on the feedback signal. The latch subcircuit is connected to the seventh node and the eighth node, and the latch subcircuit is configured to amplify and latch a signal of the seventh node and a signal of the eighth node, and output the first output signal and the second output signal respectively through a first output node and a second output node.

In some embodiments, the feedback signal includes a differential first feedback signal and a second feedback signal; and the first input subcircuit is turned on in response to the first feedback signal, and the second input subcircuit is turned on in response to the second feedback signal.

In some embodiments, the first input subcircuit includes a fifth NMOS transistor, a sixth NMOS transistor, a seventh NMOS transistor, and an eighth NMOS transistor. A drain of the fifth NMOS transistor is connected to the seventh node, a source of the fifth NMOS transistor is connected to a drain of the sixth NMOS transistor, a source of the sixth NMOS transistor is connected to a ground terminal, a gate of the fifth NMOS transistor is configured to receive one of the first signal or the first feedback signal, and a gate of the sixth NMOS transistor is configured to receive other one of the first signal or the first feedback signal. A drain of the seventh NMOS transistor is connected to the eighth node, a source of the seventh NMOS transistor is connected to a drain of the eighth NMOS transistor, a source of the eighth NMOS transistor is connected to the ground terminal, a gate of the seventh NMOS transistor is configured to receive one of the second signal or the first feedback signal, and a gate of the eighth NMOS transistor is configured to receive other one of the second signal or the first feedback signal.

In some embodiments, the second input subcircuit includes a ninth NMOS transistor, a tenth NMOS transistor, an eleventh NMOS transistor, and a twelfth NMOS transistor. A drain of the ninth NMOS transistor is connected to the seventh node, a source of the ninth NMOS transistor is connected to a drain of the tenth NMOS transistor, a source of the tenth NMOS transistor is connected to the ground terminal, a gate of the ninth NMOS transistor is configured to receive one of the third signal or the second feedback signal, and a gate of the tenth NMOS transistor is configured to receive either one of the third signal or the second feedback. A drain of the eleventh NMOS transistor is connected to the eighth node, a source of the eleventh NMOS transistor is connected to a drain of the twelfth NMOS transistor, a source of the twelfth NMOS transistor is connected to the ground terminal, a gate of the eleventh NMOS transistor is configured to receive one of the fourth signal or the second feedback signal, and a gate of the twelfth NMOS transistor is configured to receive other one of the fourth signal or the second feedback signal.

In some embodiments, the latch subcircuit includes a thirteenth NMOS transistor, a seventh PMOS transistor, a fourteenth NMOS transistor, and an eighth PMOS transistor. A gate of the thirteenth NMOS transistor and a gate of the seventh PMOS transistor are both connected to the second output node, a source of the thirteenth NMOS transistor is connected to the seventh node, a drain of the thirteenth NMOS transistor and a drain of the seventh PMOS transistor are both connected to the first output node, and a source of the seventh PMOS transistor is connected to a power supply node. A gate of the fourteenth NMOS transistor and a gate of the eighth PMOS transistor are both connected to the first output node, a source of the fourteenth NMOS transistor is connected to the eighth node, a drain of the fourteenth NMOS transistor and a drain of the eighth PMOS transistor are both connected to the second output node, and a source of the eighth PMOS transistor is connected to the power supply node.

In some embodiments, the second amplifier circuit further includes a third reset subcircuit, where the third reset subcircuit is connected between a power supply node and an output terminal of the latch subcircuit, and the third reset subcircuit is configured to reset the output terminal of the latch subcircuit.

In some embodiments, the output terminal of the latch subcircuit includes a first output node and a second output node; and the third reset subcircuit includes a ninth PMOS transistor and a tenth PMOS transistor. The ninth PMOS transistor is connected between the first output node and the power supply node, and a gate of the ninth PMOS transistor is configured to receive a second reset signal. The tenth PMOS transistor is connected between the second output node and the power supply node, and a gate of the tenth PMOS transistor is configured to receive the second reset signal.

According to some embodiments of the present disclosure, another aspect of the embodiments of the present disclosure further provides a data receiving system, which includes a plurality of cascaded data transmission circuits. Each of the plurality of data transmission circuits includes the data receiving circuit according to any one of the preceding embodiments and a latch circuit connected to the data receiving circuit; an output signal from the data transmission circuit at a previous stage is used as the feedback signal of the data transmission circuit at a next stage; and an output signal from the data transmission circuit at a last stage is used as the feedback signal of the data transmission circuit at a first stage.

In some embodiments, the data receiving circuit is configured to receive data in response to a sampling clock signal; and the data receiving system includes four cascaded data receiving circuits, and a phase difference of the sampling clock signal of the data receiving circuit at adjacent stages is 90°.

In some embodiments, the feedback signal of the data transmission circuit at the next stage is an output signal from the data receiving circuit at a previous stage or an output signal from the latch circuit at a previous stage; and the feedback signal of the data transmission circuit at the first stage is an output signal from the data receiving circuit at a last stage or an output signal from the latch circuit at a last stage.

According to some embodiments of the present disclosure, yet another aspect of the embodiments of the present disclosure further provides a memory device, including: a plurality of data ports; and a plurality of data receiving systems according to any one of the foregoing embodiments, where each of the plurality of data receiving systems corresponds to one of the plurality of data ports.

The technical solutions provided by the embodiments of the present disclosure at least have following advantages.

The first amplifier circuit performs the first comparison and the second comparison on the data signal respectively based on the first reference signal and the second reference signal, to obtain the first signal pair and the second signal pair, where a level value of the first reference signal is different from that of the second reference signal, such that for the data signals having different level values, it may be satisfied that there is greater difference between the level value of the data signal and the level value of one of the first reference signal or the second reference signal, which is beneficial to ensure that at least one of the first signal pair and the second signal pair has greater difference in level value. In this way, when the data signal received by the data receiving circuit has an intersymbol interference, it is beneficial for the second amplifier circuit to subsequently receive, based on the feedback signal, one of the first signal pair and the second signal pair that has a greater difference in level value. It is to be understood that, based on the difference between the level value of the data signal and the first reference signal and the difference between the level value of the data signal and the second reference signal, the second amplifier circuit may select to receive, based on the feedback signal, one of the first signal pair and the second signal pair that has a greater difference in level value, to ensure that the second amplifier circuit receives a pair of differential signals having a greater difference in signal level value. In this way, it is beneficial to improve accuracy of the first output signal and the second output signal outputted from the second amplifier circuit. That is, capability of the data receiving circuit in adjusting the data signal received is improved based on the first reference signal and the second reference signal. Furthermore, it is beneficial to reduce adverse effects of the intersymbol interference of the data signal received on the data receiving circuit.

BRIEF DESCRIPTION OF THE DRAWINGS

Exemplary descriptions are made to one or more embodiments with reference to pictures in the corresponding drawings, and these exemplary descriptions do not constitute limitations on the embodiments, and elements with the same reference numerals in the drawings are denoted as similar elements. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Based on analysis, it is found that when a difference between a level value of a data signal received by a data receiving circuit and a level value of a reference signal is smaller, determination of the data receiving circuit on the data signal is prone to errors. For example, the data signal that should be a high-level signal is determined as a low-level signal, which makes an output signal from the data receiving circuit go wrong.

Embodiments of the present disclosure provide a data receiving circuit, a data receiving system, and a memory device. The data receiving circuit performs a first comparison and a second comparison on a data signal respectively based on a first reference signal and a second reference signal, to obtain a first signal pair and a second signal pair, where a level value of the first reference signal is different from that of the second reference signal, such that for data signals having different level values, it may be satisfied that there is greater difference between the level value of the data signal and the level value of one of the first reference signal or the second reference signal. Thus, when the data signal received by the data receiving circuit has an intersymbol interference, it is beneficial for a second amplifier circuit to subsequently receive, based on a feedback signal, one of the first signal pair and the second signal pair that has a greater difference in level value. In this way, capability of the data receiving circuit in adjusting the data signal received is improved based on the first reference signal and the second reference signal, and adverse effects of intersymbol interference of the data signal received on the data receiving circuit are reduced. It is beneficial for the second amplifier circuit to subsequently receive, based on the feedback signal, one of the first signal pair and the second signal pair that has a greater difference in level value, it is beneficial to ensure that the second amplifier circuit receives a pair of differential signals having a greater difference in signal level value, such that it is beneficial to improve accuracy of a first output signal and a second output signal outputted from the second amplifier circuit. Therefore, based on coordination between a first amplifier circuit and the second amplifier circuit, it is beneficial to improve receiving performance of the data receiving circuit.

The embodiments of the present disclosure will be described in detail below in conjunction with the accompanying drawings. However, a person of ordinary skill in the art may understand that in the embodiments of the present disclosure, many technical details are put forward such that a reader may better understand the present disclosure. However, the technical solutions requested to be protected by the embodiments of the present disclosure may also be implemented even without these technical details or various variations and modifications based on the following embodiments.

Figure 1:
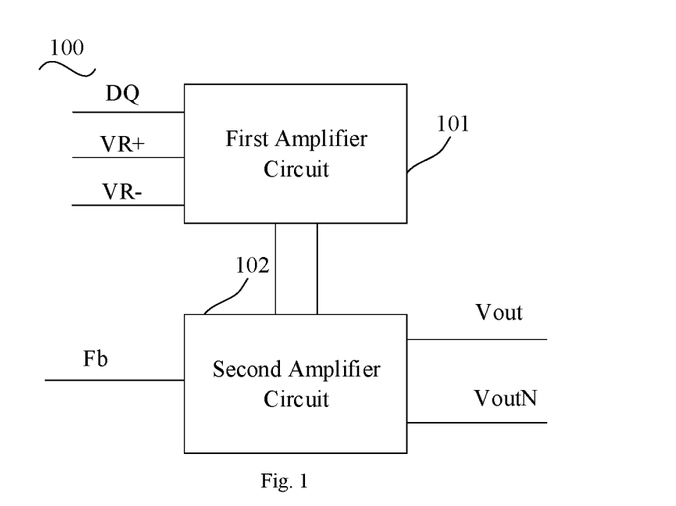
FIG. 1 is a functional block diagram of a data receiving circuit according to an embodiment of the present disclosure.
Figure 3:
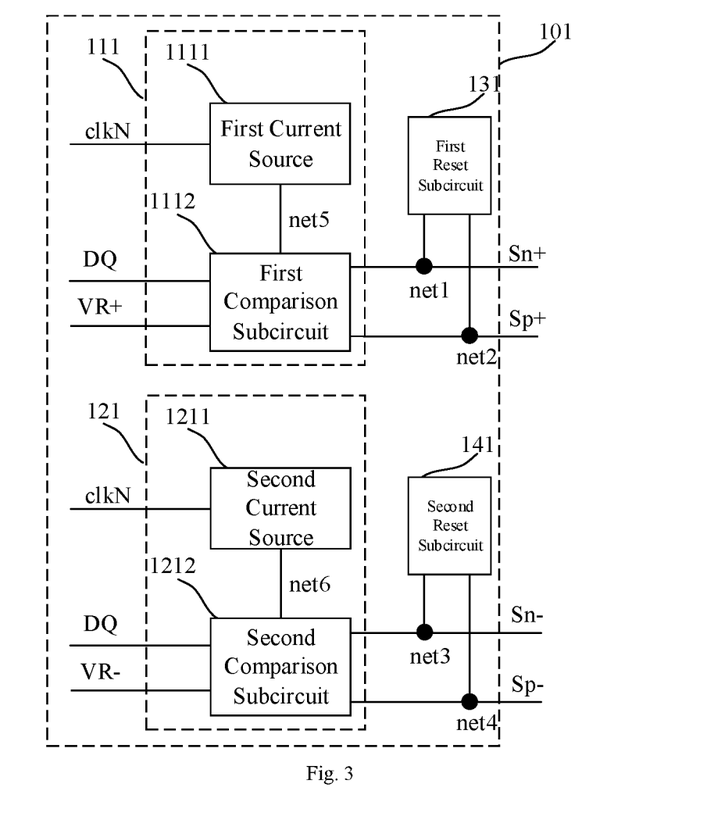
FIGS. 3 to 4 are other two functional block diagrams of a data receiving circuit according to an embodiment of the present disclosure.
Figure 4:
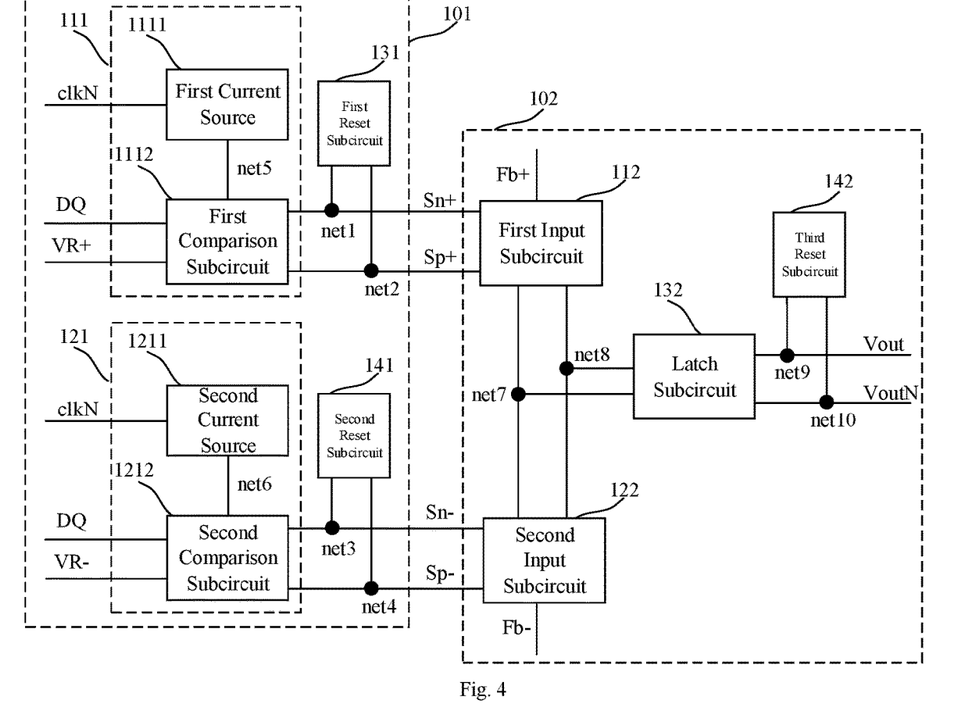
Figure 5:
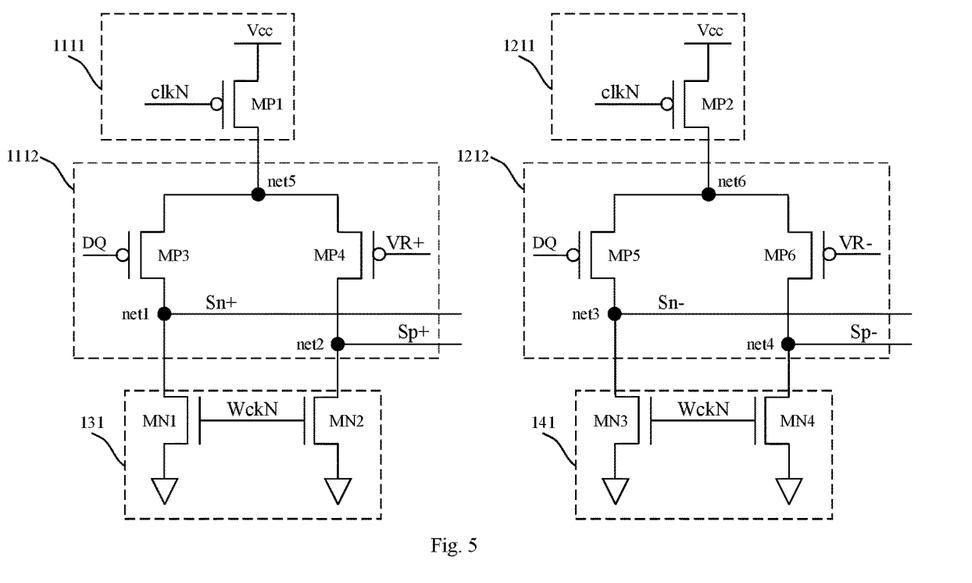
FIG. 5 is a schematic diagram showing a circuit structure of a first amplifier circuit in the data receiving circuit according to an embodiment of the present disclosure.
Figure 6:
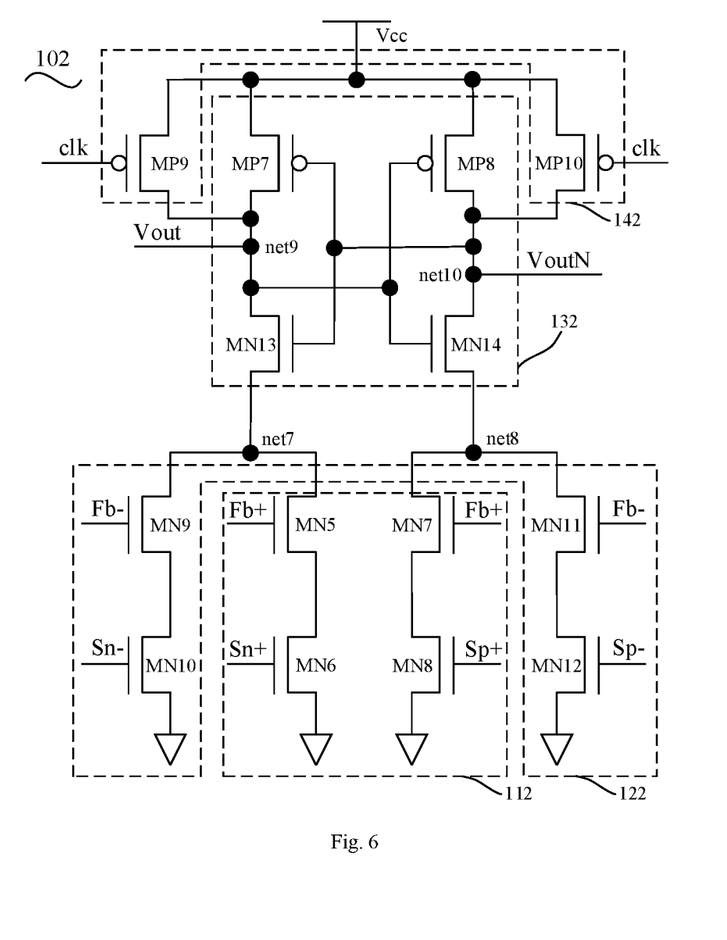
FIG. 6 is a schematic diagram showing a circuit structure of a second amplifier circuit in the data receiving circuit according to an embodiment of the present disclosure.

An embodiment of the present disclosure provides a data receiving circuit, and the data receiving circuit provided by an embodiment of the present disclosure will be described in detail below with reference to the accompanying drawings. FIG. 1 is a functional block diagram of the data receiving circuit provided by an embodiment of the present disclosure; FIGS. 3 to 4 are other two functional block diagrams of the data receiving circuit provided by an embodiment of the present disclosure; FIG. 5 is a schematic diagram showing a circuit structure of a first amplifier circuit in the data receiving circuit provided by an embodiment of the present disclosure; and FIG. 6 is a schematic diagram showing a circuit structure of a second amplifier circuit in the data receiving circuit provided by an embodiment of the present disclosure.

Referring to FIG. 1 and FIG. 3, the data receiving circuit 100 includes a first amplifier circuit 101 and a second amplifier circuit 102. The first amplifier circuit 101 is configured to receive a data signal DQ, a first reference signal VR+ and a second reference signal VR−, perform a first comparison between the data signal DQ and the first reference signal VR+ and output a first signal pair as a result of the first comparison, perform a second comparison between the data signal DQ and the second reference signal VR−, and output a second signal pair as a result of the second comparison. A level value of the first reference signal VR+ is different from a level value of the second reference signal VR−, the first signal pair includes a first signal Sn+ and a second signal Sp+, and the second signal pair includes a third signal Sn− and a fourth signal Sp−. The second amplifier circuit 102 is configured to select to receive the first signal pair or the second signal pair as input signal pairs based on a feedback signal Fb, amplify a voltage difference between the input signal pairs, and output a first output signal Vout and a second output signal VoutN as a result of the amplification, where the feedback signal Fb is obtained based on previously received data.

It is to be understood that a level value of the first reference signal VR+ is different from that of the second reference signal VR−, such that for data signals DQ having different level values, it may be satisfied that there is greater difference between the level value of the data signal DQ and the level value of one of the first reference signal VR+ or the second reference signal VR−, this is beneficial for the first amplifier circuit 101 to amplify the level value difference, such that at least one of the first signal pair and the second signal pair outputted by the first amplifier circuit 101 has a greater difference in level value. Thus, when the data signal DQ received by the data receiving circuit 100 has an intersymbol interference, it is beneficial for the second amplifier circuit 102 to subsequently receive, based on the feedback signal Fb, a pair of signals from the first signal pair and the second signal pair that has a greater difference in level value. It is to be understood that capability of the data receiving circuit 100 in adjusting the data signal received DQ is improved for the data receiving circuit 100 based on the first reference signal VR+ and the second reference signal VR−. That is, when the data signal DQ received by the data receiving circuit 100 has an intersymbol interference, the second amplifier circuit 102 is caused to receive, based on the feedback signal Fb, a pair of signals from the data signal DQ better processed by the first amplifier circuit 101, where this pair of signals from the data signal DQ better processed is a pair of signals from the first signal pair and the second signal pair having a greater difference in level value. In this way, adverse effects of the intersymbol interference of the data signal DQ received on the data receiving circuit 100 are reduced.

In addition, the second amplifier circuit 102 selects and receives, based on the feedback signal Fb, one of the first signal pair and the second signal pair having a greater difference in level value, which is beneficial to ensure that the second amplifier circuit 102 receives a pair of differential signals having a greater difference in signal level value. Thus, it is beneficial to improve accuracy of the first output signal Vout and the second output signal VoutN outputted from the second amplifier circuit 102. Therefore, based on cooperation between the first amplifier circuit 101 and the second amplifier circuit 102, it is beneficial to improve the receiving performance of the data receiving circuit 100.

In some embodiments, the level value of the first reference signal VR+ is higher than that of the second reference signal VR−, when the data signal DQ is a low-level signal and the data signal DQ received by the data receiving circuit 100 has an intersymbol interference, the second amplifier circuit 102 receives the first signal pair based on the feedback signal Fb. At this moment, the difference between the level value of the data signal DQ and the level value of the first reference signal VR+ is greater than the difference between the level value of the data signal DQ and the level value of the second reference signal VR−. That is, the difference between level values of signals in the first signal pair is greater than the difference between level values of signals in the second signal pair. So the second amplifier circuit 102 receives the first signal pair, which is advantageous to outputting the first output signal Vout and the second output signal VoutN that are acceptable. That is, the accuracy of the first output signal Vout and the second output signal VoutN is ensured. In this way, it is beneficial to reduce the adverse effects of the intersymbol interference of the data signal DQ received on the data receiving circuit 100.

In addition, when the data signal DQ is a high-level signal and the data signal DQ received by the data receiving circuit 100 has an intersymbol interference, the second amplifier circuit 102 receives the second signal pair based on the feedback signal Fb. At this moment, the difference between the level value of the data signal DQ and the level value of the first reference signal VR+ is smaller than the difference between the level value of the data signal DQ and the level value of the second reference signal VR−. That is, the difference between the level values of the signals in the first signal pair is smaller than the difference between the level values of the signals in the second signal pair. So the second amplifier circuit 102 receives the second signal pair, which is advantageous to outputting the first output signal Vout and the second output signal VoutN that are acceptable. That is, the accuracy of the first output signal Vout and the second output signal VoutN is ensured. In this way, it is beneficial to reduce the adverse effects of the intersymbol interference of the data signal DQ received on the data receiving circuit 100.

As can be seen, based on the cooperation between the first amplifier circuit 101 and the second amplifier circuit 102, when the data signal DQ received by the data receiving circuit 100 has an intersymbol interference, the second amplifier circuit 102 is caused to receive, based on the feedback signal Fb, a pair of signals from the data signal DQ better processed by the first amplifier circuit 101, to improve the accuracy of the first output signal Vout and the second output signal VoutN outputted by the second amplifier circuit 102, thereby reducing the adverse effects of the intersymbol interference of the data signal DQ received on the data receiving circuit 100.

The first amplifier circuit 101 and the second amplifier circuit 102 will be described in detail below with reference to FIGS. 3 to 6.

In some embodiments, referring to FIG. 3 and FIG. 4, the first amplifier circuit 101 includes a first comparison circuit 111 having a first node net1 and a second node net2, and a second comparison circuit 121 having a third node net3 and a fourth node net4. The first comparison circuit 111 is configured to receive the data signal DQ and the first reference signal VR+ and perform the first comparison, and output the first signal Sn+ and the second signal Sp+ respectively through the first node net1 and the second node net2. The second comparison circuit 121 is configured to receive the data signal DQ and the second reference signal VR− and perform the second comparison, and output the third signal Sn− and the fourth signal Sp− respectively through the third node net3 and the fourth node net4.

The first comparison circuit 111 amplifies a voltage difference between the data signal DQ and the first reference signal VR+ to output the first signal Sn+ and the second signal Sp+. That is, the first signal Sn+ and the second signal Sp+ are influenced by the data signal DQ and the first reference signal VR+. The second comparison circuit 121 amplifies a voltage difference between the data signal DQ and the second reference signal VR− to output the third signal Sn− and the fourth signal Sp−. That is, the third signal Sn− and the fourth signal Sp− are influenced by the data signal DQ and the second reference signal VR−. Therefore, subsequently when the second amplifier circuit 102 receives the first signal pair based on the feedback signal Fb to output the first output signal Vout and the second output signal VoutN, the first output signal Vout and the second output signal VoutN are affected by the first signal Sn+ and the second output signal Sp+. When the second amplifier circuit 102 receives the second signal pair based on the feedback signal Fb to output the first output signal Vout and the second output signal VoutN, the first output signal Vout and the second output signal VoutN are affected by the third signal Sn− and the fourth signal Sp−.

As can be seen, no matter whether the data signal DQ received by the first amplifier circuit 101 is a high-level signal or a low-level signal, the difference between the level value of the first signal Sn+ and the level value of the second signal Sp+ and the difference between the level value of the third signal Sn− and the level value of the fourth signal Sp− may be greater, and the second amplifier circuit 102 may selectively select, based on the feedback signal Fb, one of the first signal pair and the second signal pair having a greater voltage difference. That is, the data receiving circuit 100 improves the capability of the data receiving circuit 100 in adjusting the received data signal DQ based on the first reference signal VR+ and the second reference signal VR−. That is, when the data signal DQ received by the data receiving circuit 100 has an intersymbol interference, the second amplifier circuit 102 is caused to receive, based on the feedback signal Fb, a pair of signals from the data signal DQ better processed by the first amplifier circuit 101, to further adjust the first output signal Vout and the second output signal VoutN affected by this signal pair.

In some embodiments, with continued reference to FIG. 3 and FIG. 4, the first comparison circuit 111 may include a first current source 1111 and a first comparison subcircuit 1112. The first current source 1111 is connected between a power supply node Vcc (referring to FIG. 5) and a fifth node net5, and the first current source 1111 is configured to provide a current to the fifth node net5 in response to a sampling clock signal clkN. The first comparison subcircuit 1112 is connected to the first node net1, the second node net2, and the fifth node net5. The first comparison subcircuit 1112 is configured to receive the data signal DQ and the first reference signal VR+, perform the first comparison when the first current source 1111 provides the current to the fifth node net5, and output the first signal Sn+ and the second signal Sp+. The second comparison circuit 121 may include a second current source 1211 and a second comparison subcircuit 1212. The second current source 1211 is connected between the power supply node Vcc and a sixth node net6, and the second current source 1211 is configured to provide a current to the sixth node net6 in response to the sampling clock signal clkN. The second comparison subcircuit 1212 is connected to the third node net3, the fourth node net4, and the sixth node net6. The second comparison subcircuit 1212 is configured to receive the data signal DQ and the second reference signal VR−, perform the second comparison when the second current source 1211 provides the current to the sixth node net6, and output the third signal Sn− and the fourth signal Sp−.

It is to be understood that the first comparison subcircuit 1112 may control, based on the voltage difference between the data signal DQ and the first reference signal VR+, a difference between the current provided to the first node net1 and the current provided to the second node net2, to output the first signal Sn+ and the second signal Sp+. The second comparison subcircuit 1212 may control, based on the voltage difference between the data signal DQ and the second reference signal VR−, a difference between the current provided to the third node net3 and the current provided to the fourth node net4, to output the third signal Sn− and the fourth signal Sp−.

In some embodiments, a circuit structure of the first current source 1111 is the same as that of the second current source 1211; and a circuit structure of the first comparison subcircuit 1112 is the same as that of the second comparison subcircuit 1212. In this way, it is beneficial to ensure that the difference between the first signal pair outputted by the first comparison circuit 111 and the second signal pair outputted by the second comparison circuit 121 is mainly affected by the first reference signal VR+ and the second reference signal VR−, such that it is further beneficial for the data receiving circuit 100 to reduce, based on the first reference signal VR+ and the second reference signal VR−, the adverse effects of the intersymbol interference of the data signal DQ received on the data receiving circuit 100, to further improve the accuracy of the first output signal Vout and the second output signal VoutN outputted by the second amplifier circuit 102.

In some embodiments, referring to FIG. 5, the first current source 1111 may include a first PMOS transistor MP1 connected between the power supply node Vcc and the fifth node net5, and a gate of the first PMOS transistor MP1 is configured to receive the sampling clock signal clkN. The second current source 1211 includes a second PMOS transistor MP2 connected between the power supply node Vcc and the sixth node net6, and a gate of the second PMOS transistor MP2 is configured to receive the sampling clock signal clkN. When the sampling clock signal clkN is a low-level signal, the gate of the first PMOS transistor MP1 is turned on by receiving the sampling clock signal clkN to provide the current to the fifth node net5, such that the first comparison subcircuit 1112 is in an operating state to perform the first comparison between the received data signal DQ and the first reference signal VR+. The gate of the second PMOS transistor MP2 is turned on by receiving the sampling clock signal clkN to provide the current to the sixth node net6, such that the second comparison subcircuit 1212 is in the operating state to perform the second comparison between the received data signal DQ and the second reference signal VR−.

In some embodiments, with continued reference to FIG. 5, the first comparison subcircuit 1112 may include a third PMOS transistor MP3 and a fourth PMOS transistor MP4. The third PMOS transistor MP3 is connected between the first node net1 and the fifth node net5, and a gate of the third PMOS transistor MP3 is configured to receive the data signal DQ. The fourth PMOS transistor MP4 is connected between the second node net2 and the fifth node net5, and a gate of the fourth PMOS transistor MP4 is configured to receive the first reference signal VR+. The second comparison subcircuit 1212 may include a fifth PMOS transistor MP5 and a sixth PMOS transistor MP6. The fifth PMOS transistor MP5 is connected between the third node net3 and the sixth node net6, and a gate of the fifth PMOS transistor MP5 is configured to receive the data signal DQ. The sixth PMOS transistor MP6 is connected between the fourth node net4 and the sixth node net6, and a gate of the sixth PMOS transistor MP6 is configured to receive the second reference signal VR−.

It is to be noted that for the first comparison subcircuit 1112, the level value of the data signal DQ and the level value of the first reference signal VR+ are not changed synchronously, such that a turn-on moment of the third PMOS transistor MP3 configured to receive the data signal DQ is different from that of the fourth PMOS transistor MP4 configured to receive the first reference signal VR+; and at the same moment, a conduction degree of the third PMOS transistor MP3 is different from that of the fourth PMOS transistor MP4. It is to be understood that, based on a fact that the conduction degree of the third PMOS transistor MP3 is different from that of the fourth PMOS transistor MP4, the third PMOS transistor MP3 and the fourth PMOS transistor MP4 have different capabilities of shunting the current at the fifth node net5, causing a voltage of the first node net1 to be different from a voltage of the second node net2, which is beneficial to output the first signal Sn+ and the second signal Sp+ as the first signal pair having a greater difference in signal level value.

For the second comparison subcircuit 1212, the level value of the data signal DQ and the level value of the second reference signal VR− are not changed synchronously, such that a turn-on moment of the fifth PMOS transistor MP5 configured to receive the data signal DQ is different from that of the sixth PMOS transistor MP6 configured to receive the second reference signal VR−; and at the same moment, a conduction degree of the fifth PMOS transistor MP5 is different from that of the sixth PMOS transistor MP6. It is to be understood that, based on a fact that the conduction degree of the fifth PMOS transistor MP5 is different from that of the sixth PMOS transistor MP6, the fifth PMOS transistor MP5 and the sixth PMOS transistor MP6 have different capabilities of shunting the current at the sixth node net6, causing a voltage of the third node net3 to be different from a voltage of the fourth node net4, which is beneficial to output the third signal Sn− and the fourth signal Sp− as the second signal pair having a greater difference in signal level value.

In one example, when the level value of the data signal DQ is lower than that of the first reference signal VR+, the conduction degree of the third PMOS transistor MP3 is greater than that of the fourth PMOS transistor MP4, such that more currents at the fifth node net5 flow into a path where the third PMOS transistor MP3 is positioned, such that the current at the first node net1 is greater than the current at the second node net2, thereby further causing the level value of the first signal Sn+ outputted by the first node net1 to be higher, and causing the level value of the second signal Sp+ outputted by the second node net2 to be lower. When the level value of the data signal DQ is lower than that of the second reference signal VR−, the conduction degree of the fifth PMOS transistor MP5 is greater than that of the six PMOS transistors MP6, such that more currents at the sixth node net6 flow into a path where the fifth PMOS transistor MP5 is positioned, such that the current at the third node net3 is greater than the current at the fourth node net4, thereby further causing the level value of the third signal Sn− outputted by the third node net3 to be higher, and causing the level value of the fourth signal Sp− outputted by the fourth node net4 to be lower.

Similarly, when the level value of the data signal DQ is higher than that of the first reference signal VR+, the conduction degree of the third PMOS transistor MP3 is smaller than that of the fourth PMOS transistor MP4, such that the level value of the first signal Sn+ outputted by the first node net1 is lower, and the level value of the second signal Sp+ outputted by the second node net2 is higher. When the level value of the data signal DQ is higher than that of the second reference signal VR−, the conduction degree of the fifth PMOS transistor MP5 is smaller than that of the sixth PMOS transistor MP6, such that the level value of the third signal Sn− outputted by the third node net3 is lower, and the level value of the fourth signal Sp− outputted by the fourth node net4 is higher.

In some embodiments, referring to FIG. 3 and FIG. 4, the first amplifier circuit 101 may further include a first reset subcircuit 131 and a second reset subcircuit 141. The first reset subcircuit 131 is connected to the first node net1 and the second node net2, and the first reset subcircuit 131 is configured to reset the first node net1 and the second node net2. The second reset subcircuit 141 is connected to the third node net3 and the fourth node net4, and the second reset subcircuit 141 is configured to reset the third node net3 and the fourth node net4. Thus, after the data receiving circuit 100 completes the reception of the data signal DQ, the first reference signal VR+ and the second reference signal VR− and the output of the first output signal Vout and the second output signal VoutN for one time, the first reset subcircuit 131 may reset the level value of the first node net1 and the level value of the second node net2 to initial values, and the second reset subcircuit 141 may reset the level value of the third node net3 and the level value of the fourth node net4 to initial values, such that subsequently the data receiving circuit 100 performs next data reception and processing.

In some embodiments, referring to FIG. 5, the first reset subcircuit 131 may include a first NMOS transistor MN1 and a second NMOS transistor MN2. The first NMOS transistor MN1 is connected between the first node net1 and a ground terminal, and a gate of the first NMOS transistor MN1 is configured to receive a first reset signal WckN. The second NMOS transistor MN2 is connected between the second node net2 and the ground terminal, and a gate of the second NMOS transistor MN2 is configured to receive the first reset signal WckN. The second reset subcircuit 141 includes a third NMOS transistor MN3 and a fourth NMOS transistor MN4. The third NMOS transistor MN3 is connected between the third node net3 and the ground terminal, and a gate of the third NMOS transistor MN3 is configured to receive the first reset signal WckN. The fourth NMOS transistor MN4 is connected between the fourth node net4 and the ground terminal, and a gate of the fourth NMOS transistor MN4 is configured to receive the first reset signal WckN.

In one example, when the sampling clock signal clkN is a low-level signal, the first PMOS transistor MP1 and the second PMOS transistor MP2 are both turned on. At this moment, the first NMOS transistor MN1, the second NMOS transistor MN2, the third NMOS transistor MN3 and the fourth NMOS transistor MN4 are all turned off, to ensure normal operation of the data receiving circuit 100. At the same moment, the first NMOS transistor MN1 and the second NMOS transistor MN2 may be used as loads of the first comparison subcircuit 1112 to increase amplification gain of the first comparison subcircuit 1112. The third NMOS transistor MN3 and the fourth NMOS transistor MN4 may be used as loads of the second comparison subcircuit 1212 to increase amplification gain of the second comparison subcircuit 1212. When the sampling clock signal clkN is a high-level signal, the first PMOS transistor MP1 and the second PMOS transistor MP2 are both turned off, and no current flows through the first comparison subcircuit 1112 or the second comparison subcircuit 1212. At this moment, the first NMOS transistor MN1, the second NMOS transistor MN2, the third NMOS transistor MN3 and the fourth NMOS transistor MN4 are all turned on, to pull down the voltage of the first node net1, the voltage of the second node net2, the voltage of the third node net3, and the voltage of the fourth node net4. In this way, reset of the first node net1, the second node net2, the third node net3 and the fourth node net4 is implemented.

It is to be noted that the first reset signal WckN and the sampling clock signal clkN may be the same clock signal, or may be different clock signals having the same phase but different amplitudes.

In some embodiments, referring to FIG. 6, the second amplifier circuit 102 may include a first input subcircuit 112, a second input subcircuit 122, and a latch subcircuit 132. The first input subcircuit 112 is connected to a seventh node net7 and an eighth node net8, and the first input subcircuit 112 is configured to be turned on in response to the feedback signal Fb (referring to FIG. 1) to receive the first signal pair and compare the first signal pair, and respectively provide a signal to the seventh node net7 and the eighth node net8. The second input subcircuit 122 is connected to the seventh node net7 and the eighth node net8, and the second input subcircuit 122 is configured to be turned on in response to the feedback signal Fb to receive the second signal pair and compare the second signal pair, and provide a signal to the seventh node net7 and the eighth node net8, respectively. Either one of the first input subcircuit 112 or the second input subcircuit 122 is selectively turned on based on the feedback signal Fb. The latch subcircuit 132 is connected to the seventh node net7 and the eighth node net8, and the latch subcircuit 132 is configured to amplify and latch a signal of the seventh node net7 and a signal of the eighth node net8, and output the first output signal Vout and the second output signal VoutN respectively through a first output node net9 and a second output node net10.

The first input subcircuit 112 is configured to compare the first signal Sn+ with the second signal Sp+ to provide a signal to the seventh node net7 and the eighth node net8. The second input subcircuit 122 is configured to compare the third signal Sn− with the fourth signal Sp− to provide a signal to the seventh node net7 and the eighth node net8. The latch subcircuit 132 is configured to output a high-level signal to the first output node net9 according to the signal of the seventh node net7 and the signal of the eighth node net8 signal and output a low-level signal to the second output node net10, or output the low-level signal to the first output node net9 and output the high-level signal to the second output node net10.

In some embodiments, referring to FIG. 6, the feedback signal Fb (referring to FIG. 1) includes a differential first feedback signal Fb+ and a second feedback signal Fb−; and the first input subcircuit 112 is turned on in response to the first feedback signal Fb+, and the second input subcircuit 122 is turned on in response to the second feedback signal Fb−.

In one example, when the first feedback signal Fb+ is a high-level signal and the second feedback signal Fb− is a low-level signal, the first input subcircuit 112 is turned on in response to the first feedback signal Fb+. At this moment, the second input subcircuit 122 is turned off in response to the second feedback signal Fb−. That is, the first output signal Vout and the second output signal VoutN are obtained based on the first signal Sn+ and the second signal Sp+ received by the first input subcircuit 112. In another example, when the first feedback signal Fb+ is a low-level signal and the second feedback signal Fb− is a high-level signal, the first input subcircuit 112 is turned off in response to the first feedback signal Fb+, and the second input subcircuit 122 is turned on in response to the second feedback signal Fb−. That is, the first output signal Vout and the second output signal VoutN are obtained based on the third signal Sn− and the fourth signal Sp− received by the second input subcircuit 122.

In some embodiments, with continued reference to FIG. 6, the first input subcircuit 112 may include a fifth NMOS transistor MN5, a sixth NMOS transistor MN6, a seventh NMOS transistor MN7, and an eighth NMOS transistor MN8. A drain of the fifth NMOS transistor MN5 is connected to the seventh node net7, a source of the fifth NMOS transistor MN5 is connected to a drain of the sixth NMOS transistor MN6, a source of the sixth NMOS transistor MN6 is connected to a ground terminal, a gate of the fifth NMOS transistor MN5 is configured to receive one of the first signal Sn+ or the first feedback signal Fb+, and a gate of the sixth NMOS transistor MN6 is configured to receive other one of the first signal Sn+ or the first feedback signal Fb+. A drain of the seventh NMOS transistor MN7 is connected to the eighth node net8, a source of the seventh NMOS transistor MN7 is connected to a drain of the eighth NMOS transistor MN8, a source of the eighth NMOS transistor MN8 is connected to the ground terminal, a gate of the seventh NMOS transistor MN7 is configured to receive one of the second signal Sp+ or the first feedback signal Fb+, and a gate of the eighth NMOS transistor MN8 is configured to receive other one of the second signal Sp+ or the first feedback signal Fb+.

It is to be noted that in FIG. 6, an example is taken where the gate of the fifth NMOS transistor MN5 receives the first feedback signal Fb+, the gate of the sixth NMOS transistor MN6 receives the first signal Sn+, the gate of the seventh NMOS transistor MN7 receives the first feedback signal Fb+, and the gate of the eighth NMOS transistor MN8 receives the second signal Sp+. In practical applications, it is also acceptable in a case where the gate of the fifth NMOS transistor MN5 receives the first signal Sn+, the gate of the sixth NMOS transistor MN6 receives the first feedback signal Fb+, the gate of the seventh NMOS transistor MN7 receives the second signal Sp+, and the gate of the eighth NMOS transistor MN8 receives the first feedback signal Fb+.

In one example, when the level value of the data signal DQ is higher than that of the first reference signal VR+, the level value of the first signal Sn+ is low, and the level value of the second signal Sp+ is high. At this moment, when the first input subcircuit 112 is turned on in response to the first feedback signal Fb+, the gate of the sixth NMOS transistor MN6 receives the first signal Sn+, and the gate of the eighth NMOS transistor MN8 receives the second signal Sp+. In this case, the conduction degree of the eighth NMOS transistor MN8 is greater than that of the sixth NMOS transistor MN6, causing the voltage of the eighth node net8 to be smaller than that of the seventh node net7, such that a conduction degree of a fourteenth NMOS transistor MN14 is greater than that of a thirteenth NMOS transistor MN13, and the voltage of the second output node net10 is lower than that of the first output node net9. In this case, a conduction degree of an eighth PMOS transistor MP8 is smaller than that of a seventh PMOS transistor MP7, and the latch subcircuit 132 forms a positive feedback amplification, which further causes the first output signal Vout outputted by the first output node net9 to be a high-level signal, and causes the second output signal VoutN outputted by the second output node net10 to be a low-level signal. Similarly, when the level value of the data signal DQ is lower than that of the first reference signal VR+, the level value of the first signal Sn+ is high, and the level value of the second signal Sp+ is low. At this moment, when the first input subcircuit 112 is turned on in response to the first feedback signal Fb+, the first output signal Vout outputted by the first output node net9 is a low-level signal, and the second output signal VoutN outputted by the second output node net10 is a high-level signal.

In some embodiments, the second input subcircuit 122 may include a ninth NMOS transistor MN9, a tenth NMOS transistor MN10, an eleventh NMOS transistor MN11, and a twelfth NMOS transistor MN12. A drain of the ninth NMOS transistor MN9 is connected to the seventh node net7, a source of the ninth NMOS transistor MN9 is connected to a drain of the tenth NMOS transistor MN10, a source of the tenth NMOS transistor MN10 is connected to the ground terminal, a gate of the ninth NMOS transistor MN9 is configured to receive one of the third signal Sn− or the second feedback signal Fb−, and a gate of the tenth NMOS transistor MN10 is configured to receive either one of the third signal Sn− or the second feedback Fb−. A drain of the eleventh NMOS transistor MN11 is connected to the eighth node net8, a source of the eleventh NMOS transistor MN11 is connected to a drain of the twelfth NMOS transistor MN12, a source of the twelfth NMOS transistor MN12 is connected to the ground terminal, a gate of the eleventh NMOS transistor MN11 is configured to receive one of the fourth signal Sp− or the second feedback signal Fb−, and a gate of the twelfth NMOS transistor MN12 is configured to receive other one of the fourth signal Sp− or the second feedback signal Fb−.

It is to be noted that in FIG. 6 an example is taken where the gate of the ninth NMOS transistor MN9 receives the second feedback signal Fb−, the gate of the tenth NMOS transistor MN10 receives the third signal Sn−, the gate of the eleventh NMOS transistor MN11 receives the second feedback signal Fb−, and the gate of the twelfth NMOS transistor MN12 receives the fourth signal Sp−. In practical applications, it is also acceptable in a case where the gate of the ninth NMOS transistor MN9 receives the third signal Sn−, the gate of the tenth NMOS transistor MN10 receives the second feedback signal Fb−, the gate of the eleventh NMOS transistor MN11 receives the fourth signal Sp−, and the gate of the twelfth NMOS transistor MN12 receives the second feedback signal Fb−.

In one example, when the level value of the data signal DQ is higher than that of the second reference signal VR−, the level value of the third signal Sn− is low, and the level value of the fourth signal Sp− is high. At this moment, when the second input subcircuit 122 is turned on in response to the second feedback signal Fb−, the gate of the tenth NMOS transistor MN10 receives the third signal Sn−, and the gate of the twelfth NMOS transistor MN12 receives the fourth signal Sp−. In this case, the conduction degree of the twelfth NMOS transistor MN12 is greater than that of the tenth NMOS transistor MN10, causing the voltage of the eighth node net8 to be smaller than that of the seventh node net7, such that the first output signal Vout outputted by the first output node net9 is a high-level signal, and the second output signal VoutN outputted by the second output node net10 is a low-level signal. Similarly, when the level value of the data signal DQ is lower than that of the second reference signal VR−, the level value of the third signal Sn− is high, and the level value of the fourth signal Sp− is low. At this moment, when the second input subcircuit 122 is turned on in response to the second feedback signal Fb−, the first output signal Vout outputted by the first output node net9 is a low-level signal, and the second output signal VoutN outputted by the second output node net10 is a high-level signal.

It is to be noted that when a plurality of data receiving circuits 100 are cascaded, the feedback signal Fb obtained based on the previously received data refers to: the first output signal Vout and the second output signal VoutN outputted by the data receiving circuit 100 at a previous stage being used as the feedback signal Fb of the data receiving circuit 100 at a next stage; or the first output signal Vout and the second output signal VoutN outputted by the data receiving circuit 100 at a last stage being used as the feedback signal Fb of the data receiving circuit 100 at a first stage. In some embodiments, the first output signal Vout outputted by the first output node net9 of the data receiving circuit 100 at the previous stage is used as the first feedback signal Fb+ of the data receiving circuit 100 at the next stage. The second output signal VoutN outputted by the second output node net10 of the data receiving circuit 100 at the previous stage is used as the second feedback signal Fb− of the data receiving circuit 100 at the next stage. The first output signal Vout outputted by the first output node net9 of the data receiving circuit 100 at the last stage is used as the first feedback signal Fb+ of the data receiving circuit 100 at the first stage. The second output signal VoutN outputted by the second output node net10 of the data receiving circuit 100 at the last stage is used as the second feedback signal Fb− of the data receiving circuit 100 at the first stage.

It is to be understood that, when the first output signal Vout outputted by the first output node net9 of the data receiving circuit 100 at the previous stage is a high-level signal and the second output signal VoutN outputted by the second output node net10 is a low-level signal, the first feedback signal Fb+ received by the data receiving circuit 100 at the next stage is a high-level signal, and the second feedback signal Fb− is a low-level signal. In this case, the first input subcircuit 112 of the data receiving circuit 100 at the next stage is turned on in response to the first feedback signal Fb+, and the second input subcircuit 122 is turned off in response to the second feedback signal Fb−. When the first output signal Vout outputted by the first output node net9 of the data receiving circuit 100 at the previous stage is a low-level signal and the second output signal VoutN outputted by the second output node net10 is a high-level signal, the first feedback signal Fb+ received by the data receiving circuit 100 at the next stage is a low-level signal, the second feedback signal Fb− is a high-level signal. In this case, the first input subcircuit 112 of the data receiving circuit 100 at the next stage is turned off in response to the first feedback signal Fb+, and the second input subcircuit 122 is turned on in response to the second feedback signal Fb−.

In some embodiments, referring to FIG. 6, the latch subcircuit 132 may include a thirteenth NMOS transistor MN13, a seventh PMOS transistor MP7, a fourteenth NMOS transistor MN14, and an eighth PMOS transistor MP8. A gate of the thirteenth NMOS transistor MN13 and a gate of the seventh PMOS transistor MP7 are both connected to the second output node net10, a source of the thirteenth NMOS transistor MN13 is connected to the seventh node net7, a drain of the thirteenth NMOS transistor MN13 and a drain of the seventh PMOS transistor MP7 are both connected to the first output node net9, and a source of the seventh PMOS transistor MP7 is connected to a power supply node Vcc. A gate of the fourteenth NMOS transistor MN14 and a gate of the eighth PMOS transistor MP8 are both connected to the first output node net9, a source of the fourteenth NMOS transistor MN14 is connected to the eighth node net8, a drain of the fourteenth NMOS transistor MN14 and a drain of the eighth PMOS transistor MP8 are both connected to the second output node net10, and a source of the eighth PMOS transistor MP8 is connected to the power supply node Vcc.

In some embodiments, referring to FIG. 6, the second amplifier circuit 102 may further include a third reset subcircuit 142, where the third reset subcircuit 142 is connected between the power supply node Vcc and an output terminal of the latch subcircuit 132, and the third reset subcircuit 142 is configured to reset the output terminal of the latch subcircuit 132. Thus, after the data receiving circuit 100 completes the reception of the data signal DQ, the first reference signal VR+ and the second reference signal VR− and the output of the first output signal Vout and the second output signal VoutN for one time, the third reset subcircuit 142 may reset the level value of the first output node net9 and the level value of the second output node net10 to initial values, such that subsequently the data receiving circuit 100 performs next data reception and processing.

In some embodiments, with continued reference to FIG. 6, the output terminal of the latch subcircuit 132 includes a first output node net9 and a second output node net10; and the third reset subcircuit 142 includes a ninth PMOS transistor MP9 and a tenth PMOS transistor MP10. The ninth PMOS transistor MP9 is connected between the first output node net9 and the power supply node Vcc, and a gate of the ninth PMOS transistor MP9 is configured to receive a second reset signal clk. The tenth PMOS transistor MP10 is connected between the second output node net10 and the power supply node Vcc, and a gate of the tenth PMOS transistor MPP10 is configured to receive the second reset signal clk.

In one example, the second reset signal clk samples the inversion signal of the sampling clock signal clkN. With reference to FIG. 5 and FIG. 6, when the sampling clock signal clkN is a low-level signal, both the first PMOS transistor MP1 and the second PMOS transistor MP2 are turned on. At this moment, the first NMOS transistor MN1, the second NMOS transistor MN2, the third NMOS transistor MN3 and the fourth NMOS transistor MN4 are all turned off, the second reset signal clk is a high-level signal, and both the ninth PMOS transistor MP9 and the tenth PMOS transistor MP10 are turned off, to ensure the normal operation of the data receiving circuit 100. When the sampling clock signal clkN is a high-level signal, the first PMOS transistor MP1 and the second PMOS transistor MP2 are both turned off. At this moment, the first NMOS transistor MN1, the second NMOS transistor MN2, the third NMOS transistor MN3 and the fourth NMOS transistor MN4 are all turned on, the second reset signal clk is a low-level signal, the ninth PMOS transistor MP9 and the tenth PMOS transistor MP10 are also turned on, to pull up the voltage of the first output node net9 and the voltage of the second output node net10, to reset of the first output node net9 and the second output node net10.

Operating principles of the data receiving circuit 100 provided by an embodiment of the present disclosure will be described in detail below with reference to FIG. 6 and Table 1.

In some embodiments, when a plurality of data receiving circuits 100 are cascaded, the first output signal Vout outputted by the first output node net9 of the data receiving circuit 100 at the previous stage is used as the first feedback signal Fb+ of the data receiving circuit 100 at the next stage. The second output signal VoutN outputted by the second output node net10 of the data receiving circuit 100 at the previous stage is used as the second feedback signal Fb− of the data receiving circuit 100 at the next stage. The first output signal Vout outputted by the first output node net9 of the data receiving circuit 100 at the last stage is used as the first feedback signal Fb+ of the data receiving circuit 100 at the first stage. The second output signal VoutN outputted by the second output node net10 of the data receiving circuit 100 at the last stage is used as the second feedback signal Fb− of the data receiving circuit 100 at the first stage.

A description is made below by taking an example where the level value of the first reference signal VR+ received is greater than that of the second reference signal VR−. In one example, the level value of the first reference signal VR+ may be 0.7V, and the level value of the second reference signal VR− may be 0.3V. When the data signal DQ is a logic level signal 1, this represents that the level value of the data signal DQ is greater than that of the first reference signal VR+. When the data signal DQ is a logic level signal 0, this represents that the level value of the data signal DQ is smaller than that of the second reference signal VR−.

Referring to Table 1, when a data signal DQ1 received by the data receiving circuit 100 at the previous stage is the logic level signal 1, the first output signal Vout outputted by the data receiving circuit 100 at the previous stage, i.e., the first feedback signal Fb+ of the data receiving circuit 100 at the next stage, is a high-level signal, which is represented by the logic level signal 1 in Table 1. The second output signal VoutN outputted by the data receiving circuit 100 at the previous stage, i.e., the second feedback signal Fb− of the data receiving circuit 100 at the next stage is a low-level signal, which is represented by the logic level signal 0 in Table 1. At this moment, the gate of the fifth NMOS transistor MN5 and the gate of the seventh NMOS transistor MN7 are turned on by receiving the first feedback signal Fb+, and the gate of the ninth NMOS transistor MN9 and the gate of the eleventh NMOS transistor MN11 are turned off by receiving the second feedback signal Fb−. The first input subcircuit 112 is configured to compare the first signal Sn+ with the second signal Sp+, to provide a signal to the seventh node net7 and the eighth node net8, and no current flows through the second input subcircuit 122.

When the data signal DQ1 received by the data receiving circuit 100 at the previous stage is the logic level signal 1, a data signal DQ2 received by the data receiving circuit 100 at the next stage is respectively described in following two cases.

Case I. Referring to Table 1, when the data signal DQ2 received by the data receiving circuit 100 at the next stage is the logic level signal 0, there is a greater difference between the level value of the data signal DQ2 received by the data receiving circuit 100 at the next stage and the level value of the data signal DQ1 received by the data receiving circuit 100 at the previous stage, and there exists a greater intersymbol interference. At this moment, the first input subcircuit 112 in the data receiving circuit 100 at the next stage is turned on. That is, the second amplifier circuit 102 in the data receiving circuit 100 at the next stage receives the first signal Sn+ and the second signal Sp+, and the first signal pair outputted by the first comparison circuit 111 in the data receiving circuit 100 at the next stage is received by the second amplifier circuit 102. At this moment, in the data receiving circuit 100 at the next stage, the data signal DQ2 is the logic level signal 0, and the voltage difference between the data signal DQ2 and the first reference signal VR+ is greater than that between the data signal DQ2 and the second reference signal VR−, and thus there is a greater difference between the level values of the signals in the first signal pair obtained by processing by the first comparison circuit 111. At this moment, the second amplifier circuit 102 receives the first signal pair, which is more advantageous to outputting the first output signal Vout and the second output signal VoutN with higher accuracy, to reduce the adverse effects of the intersymbol interference of the data signal DQ received on the data receiving circuit 100.

Case II. Referring to Table 1, when the data signal DQ2 received by the data receiving circuit 100 at the next stage is the logic level signal 1, there is a smaller difference between the level value of the data signal DQ2 received by the data receiving circuit 100 at the next stage and the level value of the data signal DQ1 received by the data receiving circuit 100 at the previous stage, and there exists a smaller or even no intersymbol interference. At this moment, the first input subcircuit 112 in the data receiving circuit 100 at the next stage is turned on, and the first signal pair outputted by the first comparison circuit 111 in the data receiving circuit 100 at the next stage is received by the second amplifier circuit 102.

Referring to Table 1, when the data signal DQ1 received by the data receiving circuit 100 at the previous stage is the logic level signal 0, the first output signal Vout outputted by the data receiving circuit 100 at the previous stage, i.e., the first feedback signal Fb+ of the data receiving circuit 100 at the next stage, is a low-level signal, which is represented by the logic level signal 0 in Table 1. The second output signal VoutN outputted by the data receiving circuit 100 at the previous stage, i.e., the second feedback signal Fb− of the data receiving circuit 100 at the next stage is a high-level signal, which is represented by the logic level signal 1 in Table 1. At this moment, the gate of the fifth NMOS transistor MN5 and the gate of the seventh NMOS transistor MN7 are turned off by receiving the first feedback signal Fb+, and the gate of the ninth NMOS transistor MN9 and the gate of the eleventh NMOS transistor MN11 are turned on by receiving the second feedback signal Fb−. The second input subcircuit 122 is configured to compare the third signal Sn− with the fourth signal Sp−, to provide a signal to the seventh node net7 and the eighth node net8, and no current flows through the first input subcircuit 112.

When the data signal DQ1 received by the data receiving circuit 100 at the previous stage is the logic level signal 0, the data signal DQ2 received by the data receiving circuit 100 at the next stage is respectively described in following two cases.

Case III: Referring to Table 1, when the data signal DQ2 received by the data receiving circuit 100 at the next stage is the logic level signal 0, there is a smaller difference between the level value of the data signal DQ2 received by the data receiving circuit 100 at the next stage and the level value of the data signal DQ1 received by the data receiving circuit 100 at the previous stage, and there exists a smaller or even no intersymbol interference. At this moment, the second input subcircuit 122 in the data receiving circuit 100 at the next stage is turned on, and the second signal pair outputted by the second comparison circuit 121 in the data receiving circuit 100 at the next stage is received by the second amplifier circuit 102.

Case IV: Referring to Table 1, when the data signal DQ2 received by the data receiving circuit 100 at the next stage is the logic level signal 1, there is a greater difference between the level value of the data signal DQ2 received by the data receiving circuit 100 at the next stage and the level value of the data signal DQ1 received by the data receiving circuit 100 at the previous stage, and there exists a greater intersymbol interference. At this moment, the second input subcircuit 122 in the data receiving circuit 100 at the next stage is turned on. That is, the second amplifier circuit 102 in the data receiving circuit 100 at the next stage receives the third signal Sn− and the fourth signal Sp−, and the second signal pair outputted by the second comparison circuit 121 in the data receiving circuit 100 at the next stage is received by the second amplifier circuit 102. At this moment, in the data receiving circuit 100 at the next stage, the data signal DQ2 is the logic level signal 1, and the voltage difference between the data signal DQ2 and the second reference signal VR− is greater than that between the data signal DQ2 and the first reference signal VR+, and thus there is a greater difference between the level values of the signals in the second signal pair obtained by processing by the second comparison circuit 121. At this moment, the second amplifier circuit 102 receives the second signal pair, which is more advantageous to outputting the first output signal Vout and the second output signal VoutN with higher accuracy, to reduce the adverse effects of the intersymbol interference of the data signal DQ received on the data receiving circuit 100.

TABLE I

| The data signal DQ1 received by the data transmission circuit at the previous stage | The data signal DQ2 received by the data transmission circuit at the next stage | The first feedback signal Fb+ received by the data transmission circuit at the next stage | The second feedback signal Fb− received by the data transmission circuit at the next stage | The signal pair received by the second amplifier circuit in the data transmission circuit at the next stage |
|---|---|---|---|---|
| 1 | 0 | 1 | 0 | Sn+, Sp+ |
| 1 | 1 | 1 | 0 | Sn+, Sp+ |
| 0 | 0 | 0 | 1 | Sn−, Sp− |
| 0 | 1 | 0 | 1 | Sn−, Sp− |

It is to be noted that, in the above description about the high-level signal and the low-level signal, the high-level signal may have a level value greater than or equal to the power supply voltage, and the low-level signal may have a level value less than or equal to a ground voltage. Moreover, the high-level signal and the low-level signal are relative, and a level value range of the high-level signal and a level value range of the low-level signal may be determined according to a device. For example, for an NMOS transistor, the high-level signal has a level value range of a gate voltage that can turn on the NMOS transistor, the low-level signal has a level value range of a gate voltage that can turn off the NMOS transistor. For a PMOS transistor, the low-level signal has a level value range of a gate voltage that can turn off the PMOS transistor, and the high-level signal has a level value range of a gate voltage that can turn off the PMOS transistor.

To sum up, the first comparison and the second comparison are respectively performed on the data signal DQ based on the first reference signal VR+ and the second reference signal VR−, to obtain the first signal pair and the second signal pair, where the level value of the first reference signal VR+ is different from that of the second reference signal VR−, such that for data signals DQ having different level values, it may be satisfied that there is greater difference between the level value of the data signal DQ and the level value of one of the first reference signal VR+ or the second reference signal VR−. Thus, when the data signal DQ received by the data receiving circuit 100 has an intersymbol interference, it is beneficial for the second amplifier circuit 102 to subsequently receive, based on the feedback signal Fb, one of the first signal pair and the second signal pair that has a greater difference in level value. In this way, capability of the data receiving circuit 100 in adjusting the data signal DQ received is improved based on the first reference signal VR+ and the second reference signal VR−, and adverse effects of the intersymbol interference of the data signal DQ received on the data receiving circuit 100 are reduced. It is beneficial for the second amplifier circuit 102 to subsequently receive, based on the feedback signal Fb, one of the first signal pair and the second signal pair that has a greater difference in level value, it is beneficial to ensure that the second amplifier circuit 102 receives a pair of differential signals having a greater difference in signal level value, such that it is beneficial to improve accuracy of the first output signal Vout and the second output signal VoutN outputted from the second amplifier circuit 102. Therefore, based on cooperation between the first amplifier circuit 101 and the second amplifier circuit 102, it is beneficial to improve the receiving performance of the data receiving circuit 100.

Figure 2:
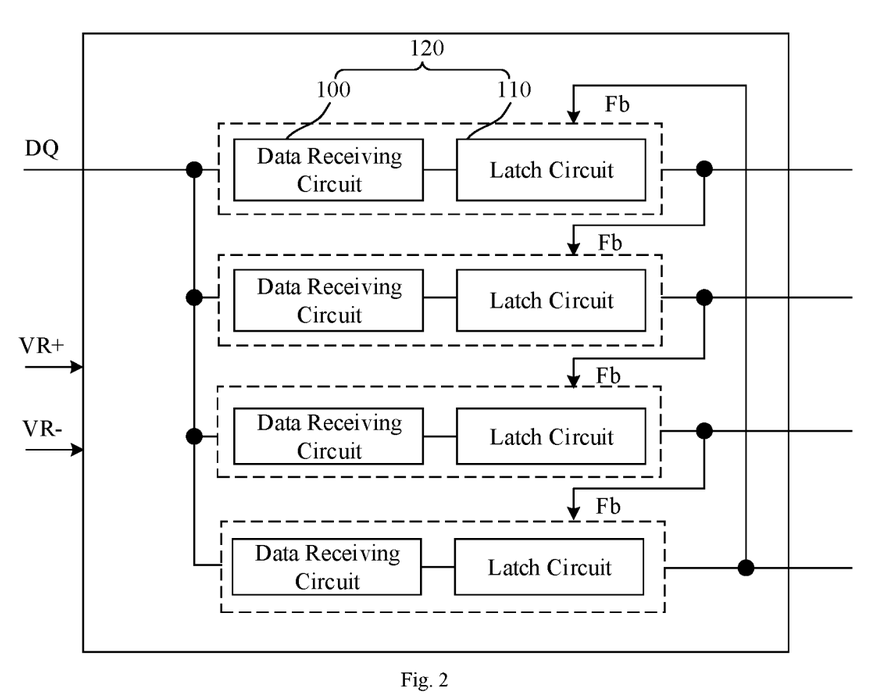
FIG. 2 is a functional block diagram of a data receiving system according to another embodiment of the present disclosure.

Another embodiment of the present disclosure further provides a data receiving system, and the data receiving system provided by another embodiment of the present disclosure will be described in detail below with reference to the accompanying drawings. FIG. 2 is a functional block diagram of the data receiving system provided by another embodiment of the present disclosure.

Referring to FIG. 2, the data receiving system includes a plurality of cascaded data transmission circuits 120, where each of the plurality of data transmission circuits 120 includes the data receiving circuit 100 according to any one of the embodiments of the present disclosure and a latch circuit 110 connected to the data receiving circuit 100. An output signal from the data transmission circuit 120 at the previous stage is used as the feedback signal Fb of the data transmission circuit 120 at the next stage; and an output signal from the data transmission circuit 120 at the last stage is used as the feedback signal Fb of the data transmission circuit 120 at the first stage.

The latch circuit 110 and the data receiving circuit 100 are provided in one-to-one correspondence, where the latch circuit 110 is configured to latch and output a signal outputted by the data receiving circuit 100 corresponding to the latch circuit 110.

In some embodiments, the data receiving circuit 100 is configured to receive data in response to the sampling clock signal clkN (referring to FIG. 3); and the data receiving system includes four cascaded data receiving circuits 100, and a phase difference of the sampling clock signal clkN of the data receiving circuit 100 at adjacent stages is 90°. In this way, a period of the sampling clock signal clkN is twice that of the data signal DQ received by the data port, which is beneficial to clock routing and saving power consumption.

It is to be noted that, in FIG. 1 an example is taken where the data receiving system includes four cascaded data receiving circuits 100, and the phase difference of the sampling clock signal of the data receiving circuit 100 at adjacent stages is 90°. In practical applications, number of the cascaded data receiving circuits 100 included in the data receiving system is not limited, and the phase difference of the sampling clock signal of the data receiving circuit 100 at adjacent stages may be reasonably set based on the number of the cascaded data receiving circuits 100.

In some embodiments, the feedback signal Fb of the data transmission circuit 120 at the next stage is an output signal from the data receiving circuit 100 at the previous stage or an output signal from the latch circuit 110 at the previous stage; and the feedback signal Fb of the data transmission circuit 120 at the first stage is an output signal from the data receiving circuit 100 at the last stage or an output signal from the latch circuit 110 at the last stage. That is, in an example, the feedback signal Fb of the data transmission circuit 120 at the next stage is the output signal from the data receiving circuit 100 at the previous stage. In this way, the output signal from the data receiving circuit 100 is directly transmitted to the data transmission circuit 120 at the next stage without passing through the latch circuit 110, which is beneficial to reducing transmission delay of data. In another example, the feedback signal Fb of the data transmission circuit 120 at the next stage is the output signal from the latch circuit 110 at the previous stage.

To sum up, the data receiving system provided by another embodiment of the present disclosure may perform the first comparison and the second comparison on the data signal DQ respectively based on the first reference signal VR+ and the second reference signal VR−, to obtain the first signal pair and the second signal pair, such that for data signals DQ having different level values, it may be satisfied that there is greater difference between the level value of the data signal DQ and the level value of one of the first reference signal VR+ or the second reference signal VR−. Thus, when the data signal DQ received by the data receiving circuit 100 has an intersymbol interference, it is beneficial for the second amplifier circuit 102 to subsequently receive, based on the feedback signal Fb, one of the first signal pair and the second signal pair that has a greater difference in level value, to reduce the adverse effects of the intersymbol interference of the data signal DQ received on the data receiving circuit 100. Furthermore, it is beneficial to ensure that the second amplifier circuit 102 receives a pair of differential signals having a greater difference in signal level value, such that it is beneficial to improve accuracy of the first output signal Vout and the second output signal VoutN outputted from the second amplifier circuit 102. Thus, it is beneficial to improve the receiving performance of the data receiving system.

Yet another embodiment of the present disclosure further provides a memory device, including: a plurality of data ports; and a plurality of data receiving systems provided in another embodiment of the present disclosure, where each of the plurality of data receiving system corresponds to one of the plurality of data ports. In this way, each data port in the memory device can flexibly adjust the received data signal DQ through the data receiving system, and improve the capability in adjusting the first output signal Vout and the second output signal VoutN, thereby improving the receiving performance of the memory device.

In some embodiments, the memory device may be a DDR memory, such as a DDR4 memory, a DDR5 memory, a DDR6 memory, an LPDDR4 memory, an LPDDR5 memory, or an LPDDR6 memory.

Those of ordinary skill in the art can understand that the above-mentioned embodiments are some embodiments for realizing the present disclosure, but in practical applications, various changes may be made to them in form and details without departing from the spirit and scope of the embodiments of the present disclosure. Any person skilled in the art can make their own changes and modifications without departing from the spirit and scope of the embodiments of the present disclosure. Therefore, the protection scope of the embodiments of the present disclosure shall be subject to the scope defined by the claims.

What is claimed is:

1. A data receiving circuit, comprising:
a first amplifier circuit configured to receive a data signal, a first reference signal and a second reference signal, perform a first comparison between the data signal and the first reference signal and output a first signal pair as a result of the first comparison, perform a second comparison between the data signal and the second reference signal, and output a second signal pair as a result of the second comparison;
wherein a level value of the first reference signal is different from a level value of the second reference signal, the first signal pair comprising a first signal and a second signal, and the second signal pair comprising a third signal and a fourth signal; and
a second amplifier circuit configured to select to receive the first signal pair or the second signal pair as input signal pairs based on a feedback signal, amplify a voltage difference between the input signal pairs, and output a first output signal and a second output signal as a result of the amplification, wherein the feedback signal is obtained based on previously received data; and,
wherein the second amplifier circuit comprises:
a first input subcircuit connected to a seventh node and an eighth node, the first input subcircuit being configured to be turned on in response to the feedback signal to receive the first signal pair and compare the first signal pair, and respectively provide a signal to the seventh node and the eighth node;
a second input subcircuit connected to the seventh node and the eighth node, the second input subcircuit being configured to be turned on in response to the feedback signal to receive the second signal pair and compare the second signal pair, and provide a signal to the seventh node and the eighth node, respectively,
wherein either of the first input subcircuit and the second input subcircuit is selectively turned on based on the feedback signal; and
a latch subcircuit connected to the seventh node and the eighth node, the latch subcircuit being configured to amplify and latch a signal of the seventh node and a signal of the eighth node, and output the first output signal and the second output signal respectively through a first output node and a second output node.

2. The data receiving circuit of claim 1, wherein the first amplifier circuit comprises:
a first comparison circuit having a first node and a second node, the first comparison circuit being configured to receive the data signal and the first reference signal and perform the first comparison, and output the first signal and the second signal respectively through the first node and the second node; and
a second comparison circuit having a third node and a fourth node, the second comparison circuit being configured to receive the data signal and the second reference signal and perform the second comparison, and output the third signal and the fourth signal respectively through the third node and the fourth node.

3. The data receiving circuit of claim 2, wherein the first comparison circuit comprises:
a first current source connected between a power supply node and a fifth node, the first current source being configured to provide a current to the fifth node in response to a sampling clock signal; and
a first comparison subcircuit connected to the first node, the second node and the fifth node, the first comparison subcircuit being configured to receive the data signal and the first reference signal, perform the first comparison when the first current source provides the current to the fifth node, and output the first signal and the second signal;
the second comparison circuit comprises:
a second current source connected between the power supply node and a sixth node, the second current source being configured to provide a current to the sixth node in response to the sampling clock signal; and a second comparison subcircuit connected to the third node, the fourth node and the sixth node, the second comparison subcircuit being configured to receive the data signal and the second reference signal, perform the second comparison when the second current source provides the current to the sixth node, and output the third signal and the fourth signal.

4. The data receiving circuit of claim 3, wherein a circuit structure of the first current source is the same as a circuit structure of the second current source; and a circuit structure of the first comparison subcircuit is the same as a circuit structure of the second comparison subcircuit.

5. The data receiving circuit of claim 3, wherein the first current source comprises:
a first PMOS transistor connected between the power supply node and the fifth node, a gate of the first PMOS transistor being configured to receive the sampling clock signal;
wherein the second current source comprises:
a second PMOS transistor connected between the power supply node and the sixth node, a gate of the second PMOS transistor being configured to receive the sampling clock signal.

6. The data receiving circuit of claim 3, wherein the first comparison subcircuit comprises:
a third PMOS transistor connected between the first node and the fifth node, a gate of the third PMOS transistor being configured to receive the data signal; and
a fourth PMOS transistor connected between the second node and the fifth node, a gate of the fourth PMOS transistor being configured to receive the first reference signal;
wherein the second comparison subcircuit comprises:
a fifth PMOS transistor connected between the third node and the sixth node, a gate of the fifth PMOS transistor being configured to receive the data signal; and
a sixth PMOS transistor connected between the fourth node and the sixth node, a gate of the sixth PMOS transistor being configured to receive the second reference signal.

7. The data receiving circuit of claim 3, wherein the first amplifier circuit further comprises:
a first reset subcircuit connected to the first node and the second node, the first reset subcircuit being configured to reset the first node and the second node; and
a second reset subcircuit connected to the third node and the fourth node, the second reset subcircuit being configured to reset the third node and the fourth node.

8. The data receiving circuit of claim 7, wherein the first reset subcircuit comprises:
a first NMOS transistor connected between the first node and a ground terminal, a gate of the first NMOS transistor being configured to receive a first reset signal;
a second NMOS transistor connected between the second node and the ground terminal, a gate of the second NMOS transistor being configured to receive the first reset signal;
wherein the second reset subcircuit comprises:
a third NMOS transistor connected between the third node and the ground terminal, a gate of the third NMOS transistor being configured to receive the first reset signal; and
a fourth NMOS transistor connected between the fourth node and the ground terminal, a gate of the fourth NMOS transistor being configured to receive the first reset signal.

9. The data receiving circuit of claim 1, wherein the feedback signal comprises a differential first feedback signal and a second feedback signal, the first input subcircuit being turned on in response to the first feedback signal, and the second input subcircuit being turned on in response to the second feedback signal.

10. The data receiving circuit of claim 9, wherein the first input subcircuit comprises:
a fifth NMOS transistor and a sixth NMOS transistor, a drain of the fifth NMOS transistor being connected to the seventh node, a source of the fifth NMOS transistor being connected to a drain of the sixth NMOS transistor, a source of the sixth NMOS transistor being connected to a ground terminal, a gate of the fifth NMOS transistor being configured to receive one of the first signal or the first feedback signal, and a gate of the sixth NMOS transistor being configured to receive other one of the first signal or the first feedback signal; and
a seventh NMOS transistor and an eighth NMOS transistor, a drain of the seventh NMOS transistor being connected to the eighth node, a source of the seventh NMOS transistor being connected to a drain of the eighth NMOS transistor, a source of the eighth NMOS transistor being connected to the ground terminal, a gate of the seventh NMOS transistor being configured to receive one of the second signal or the first feedback signal, and a gate of the eighth NMOS transistor being configured to receive other one of the second signal or the first feedback signal.

11. The data receiving circuit of claim 9, wherein the second input subcircuit comprises:
a ninth NMOS transistor and a tenth NMOS transistor, a drain of the ninth NMOS transistor being connected to the seventh node, a source of the ninth NMOS transistor being connected to a drain of the tenth NMOS transistor, and a source of the tenth NMOS transistor being connected to the ground terminal;
wherein a gate of the ninth NMOS transistor is configured to receive one of the third signal or the second feedback signal, a gate of the tenth NMOS transistor being configured to receive either one of the third signal or the second feedback; and
an eleventh NMOS transistor and a twelfth NMOS transistor, a drain of the eleventh NMOS transistor being connected to the eighth node, a source of the eleventh NMOS transistor being connected to a drain of the twelfth NMOS transistor, and a source of the twelfth NMOS transistor being connected to the ground terminal;
wherein a gate of the eleventh NMOS transistor is configured to receive one of the fourth signal or the second feedback signal, a gate of the twelfth NMOS transistor being configured to receive other one of the fourth signal or the second feedback signal.

12. The data receiving circuit of claim 1, wherein the latch subcircuit comprises:
a thirteenth NMOS transistor and a seventh PMOS transistor, a gate of the thirteenth NMOS transistor and a gate of the seventh PMOS transistor being both connected to the second output node, a source of the thirteenth NMOS transistor being connected to the seventh node, a drain of the thirteenth NMOS transistor and a drain of the seventh PMOS transistor being both connected to the first output node, and a source of the seventh PMOS transistor being connected to a power supply node; and a fourteenth NMOS transistor and an eighth PMOS transistor, a gate of the fourteenth NMOS transistor and a gate of the eighth PMOS transistor being both connected to the first output node, a source of the fourteenth NMOS transistor being connected to the eighth node, a drain of the fourteenth NMOS transistor and a drain of the eighth PMOS transistor being both connected to the second output node, and a source of the eighth PMOS transistor being connected to the power supply node.

13. The data receiving circuit of claim 1, wherein the second amplifier circuit further comprises:
a third reset subcircuit connected between a power supply node and an output terminal of the latch subcircuit, the third reset subcircuit being configured to reset the output terminal of the latch subcircuit.

14. The data receiving circuit of claim 13, wherein the output terminal of the latch subcircuit comprises a first output node and a second output node; and the third reset subcircuit comprises:
a ninth PMOS transistor connected between the first output node and the power supply node, a gate of the ninth PMOS transistor being configured to receive a second reset signal; and
a tenth PMOS transistor connected between the second output node and the power supply node, a gate of the tenth PMOS transistor being configured to receive the second reset signal.

15. A data receiving system, comprising:
a plurality of cascaded data transmission circuits, each of the plurality of data transmission circuits comprising the data receiving circuit according to claim 1 and a latch circuit connected to the data receiving circuit; wherein
an output signal from the data transmission circuit at a previous stage is used as the feedback signal of the data transmission circuit at a next stage; and
an output signal from the data transmission circuit at a last stage is used as the feedback signal of the data transmission circuit at a first stage.

16. The data receiving system of claim 15, wherein the data receiving circuit is configured to receive data in response to a sampling clock signal; and the data receiving system comprises four cascaded data receiving circuits, a phase difference of the sampling clock signal of the data receiving circuit at adjacent stages being 90°.

17. The data receiving system of claim 15, wherein the feedback signal of the data transmission circuit at the next stage is an output signal from the data receiving circuit at a previous stage or an output signal from the latch circuit at a previous stage; and the feedback signal of the data transmission circuit at the first stage is an output signal from the data receiving circuit at a last stage or an output signal from the latch circuit at a last stage.

18. A memory device, comprising
a plurality of data ports; and
a plurality of data receiving systems as claimed in claim 15, each of the plurality of data receiving systems corresponding to one of the plurality of data ports.

* * * * *